(12) United States Patent
Yoshida et al.

(10) Patent No.: US 7,279,067 B2
(45) Date of Patent: Oct. 9, 2007

(54) PORT STRUCTURE IN SEMICONDUCTOR PROCESSING SYSTEM

(75) Inventors: Tetsuo Yoshida, Yamanashi (JP);
Yoshiaki Sasaki, Yamanashi (JP);
Hiroaki Saeki, Yamanashi (JP);
Yasushi Taniyama, Aichi (JP); Hiroshi Takizawa, Aichi (JP)

(73) Assignee: Tokyo Electron Limited, Tokyo (JP)

( * ) Notice: Subject to any disclaimer, the term of this patent is extended or adjusted under 35 U.S.C. 154(b) by 393 days.

(21) Appl. No.: 10/503,940

(22) PCT Filed: Feb. 17, 2003

(86) PCT No.: PCT/JP03/01644

§ 371 (c)(1),
(2), (4) Date: Aug. 17, 2004

(87) PCT Pub. No.: WO03/071598

PCT Pub. Date: Aug. 28, 2003

(65) Prior Publication Data

US 2005/0103270 A1    May 19, 2005

(30) Foreign Application Priority Data

Feb. 22, 2002  (JP)  ............................. 2002-047189

(51) Int. Cl.
*C23F 1/00* (2006.01)
*H01L 21/306* (2006.01)
*C23C 16/00* (2006.01)
*B65G 49/07* (2006.01)

(52) U.S. Cl. .................. 156/345.32; 156/345.33; 118/719; 118/733; 414/935; 414/937

(58) Field of Classification Search ........... 156/345.31, 156/345.32; 414/937, 940, 222.04; 118/719
See application file for complete search history.

(56) References Cited

U.S. PATENT DOCUMENTS 6,318,953 B1 * 11/2001 Bonora et al. ............... 414/754
6,409,448 B1 *  6/2002 Sindledecker .......... 414/222.04

FOREIGN PATENT DOCUMENTS

JP  10-56046  2/1998
JP  10-139155  5/1998

* cited by examiner

*Primary Examiner*—Karla Moore
(74) *Attorney, Agent, or Firm*—Oblon, Spivak, McClelland, Maier & Neustadt, P.C.

(57) ABSTRACT

In a port structure 16A in a semiconductor processing system 2, a door 20A is disposed in a port 12A defined by upright wall 52 and 54. A table 48 opposed to the port is disposed outside the system. Defined on the table is a mount region 76 for mounting an open type cassette 18A for a process subject substrate W. A hood 50 is disposed rotatable relative to the table. The hood defines in its closed position a closed space surrounding the mount region and port, the space having a size to receive the cassette. First ventholes 58 are formed in the upright walls and/or the door so as to introduce gas from within the system into the closed space in the hood. Second ventholes 72 are formed in the table so as to discharge the gas can be discharged out of the closed space.

12 Claims, 16 Drawing Sheets

PORT STRUCTURE IN SEMICONDUCTOR PROCESSING SYSTEM

FIELD OF THE INVENTION

The present invention relates to a port structure for loading and unloading a substrate to be processed into and from a semiconductor processing system. The term semiconductor processing used herein denotes various processes performed to manufacture a semiconductor device or a structure connected to a semiconductor device, e.g., wiring and electrodes, on a substrate to be processed such as a semiconductor wafer or an LCD substrate by way of forming a semiconductor layer, an insulating layer, a conductive layer and the like on the substrate to be processed into a specified pattern.

BACKGROUND OF THE INVENTION

In order to manufacture a semiconductor integrated circuit, various processes such as film forming, etching, oxidation and diffusion are performed on a wafer. In such processes, a throughput and a yield are required to be improved along with the trend of miniaturization and high integration of the semiconductor integrated circuit. From this point of view, a semiconductor processing system known as a so-called cluster tool has been developed, wherein a plurality of processing apparatuses performing a same process or a plural number of processing apparatuses performing different processes are connected with one another via a common transfer chamber such that various processes can be successively executed without exposing a wafer to the atmosphere. A cluster tool type semiconductor processing system is disclosed in, e.g., Japanese Patent Laid-open Publication Nos. 2000-208589 and 2000-299367.

As for such a processing system, there is a type in which a port structure for mounting a cassette with semiconductor wafers is disposed at a front end thereof. A wafer in the cassette is carried into the system by a transfer arm and then loaded into a load-lock chamber capable of controlling a pressure to be set at a level between the vacuum and the atmospheric pressure. Next, the wafer is loaded into a common vacuum transfer chamber whose peripheral portions are connected to a plurality of vacuum processing apparatuses and then sequentially loaded into each of the vacuum processing apparatuses surrounding the common transfer chamber located at the center to thereby undergo continuous processes. Further, a processed wafer returns to a primary cassette along, e.g., a primary path.

In general, in a facility in which a semiconductor processing system is installed, an atmosphere of clean air is maintained at a predetermined level of cleanliness. Further, in the processing system, a chamber into which the wafer is introduced maintains an atmosphere of clean air at a higher level of cleanliness in order to more completely prevent particles from being introduced into a succeeding load-lock chamber and the like.

A cassette itself has a closed structure or an open structure depending on a wafer size. For example, in case of a cassette for 300 mm wafers, the cassette itself has a closed structure (closed type cassette). In such case, when the wafer is loaded thereinto, a cover of an opening of the cassette is removed, and an operation is performed while keeping the opening close to a port of the processing system (see, e.g., Japanese Patent Laid-open Application No. 1999-145245). Accordingly, a highly stable loading operation can be performed.

Meanwhile, in case of a cassette for, e.g., 200 mm wafers, the cassette itself has an open structure (open type cassette). In this case, it is preferable to separate the cassette from an operator in order to perform the loading operation safely.

SUMMARY OF THE INVENTION

It is, therefore, an object of the present invention to provide a compact and highly stable port structure in a semiconductor processing system, which is capable of avoiding a contamination of a wafer.

In accordance with a preferred embodiment of the present invention, there is provided a port structure for loading and unloading a substrate to be processed into and from a semiconductor processing system, wherein an inside of the system is set to have a positive pressure compared to an outside thereof by a gas supply, the port structure including: a bulkhead for partitioning the inside and the outside of the system and having a port for passing therethrough the substrate to be processed; a door for opening and closing the port; a table disposed outside the system to face the port, wherein the table is provided with a mount region for mounting thereon an open cassette accommodating therein a plurality of substrates to be processed in multi-levels; a hood rotatably disposed between a closed position and an open position with respect to the table, wherein the hood at the closed position forms, together with the bulkhead and the table, a closed space surrounding the mount region and the port, the closed space having a size to accommodate therein the cassette mounted on the mount region, and the hood at the open position exposes the mount region; a driving unit for rotating the hood; first ventholes formed through at least one of the bulkhead and the door so as to introduce the gas from the inside of the system into the closed space; and second ventholes formed through the table so as to discharge the gas out of the closed space.

In accordance with another preferred embodiment of the present invention, there is provided A port structure for loading and unloading a substrate to be processed into and from a semiconductor processing system, including: a bulkhead for partitioning an inside and an outside of the system and having a port therethrough for passing the substrate to be processed; a door for opening and closing the port; a table disposed outside the system to face the port, wherein the table is provided with a mount region for mounting thereon an open cassette accommodating therein in multi-levels a plurality of substrates to be processed; a transparent hood rotatably disposed between a closed position and an open position with respect to the table, wherein the hood at the closed position forms, together with the bulkhead and the table, a closed space surrounding the mount region and the port, the closed space having a size to accommodate therein the cassette mounted on the mount region, and the hood at the open position exposes the mount region; and a driving unit for rotating the hood, wherein the table has a slit for passing the rotating hood therethrough, and the hood is located under the table while in an open position.

DETAILED DESCRIPTION OF THE PREFERRED EMBODIMENTS

Figure 1:
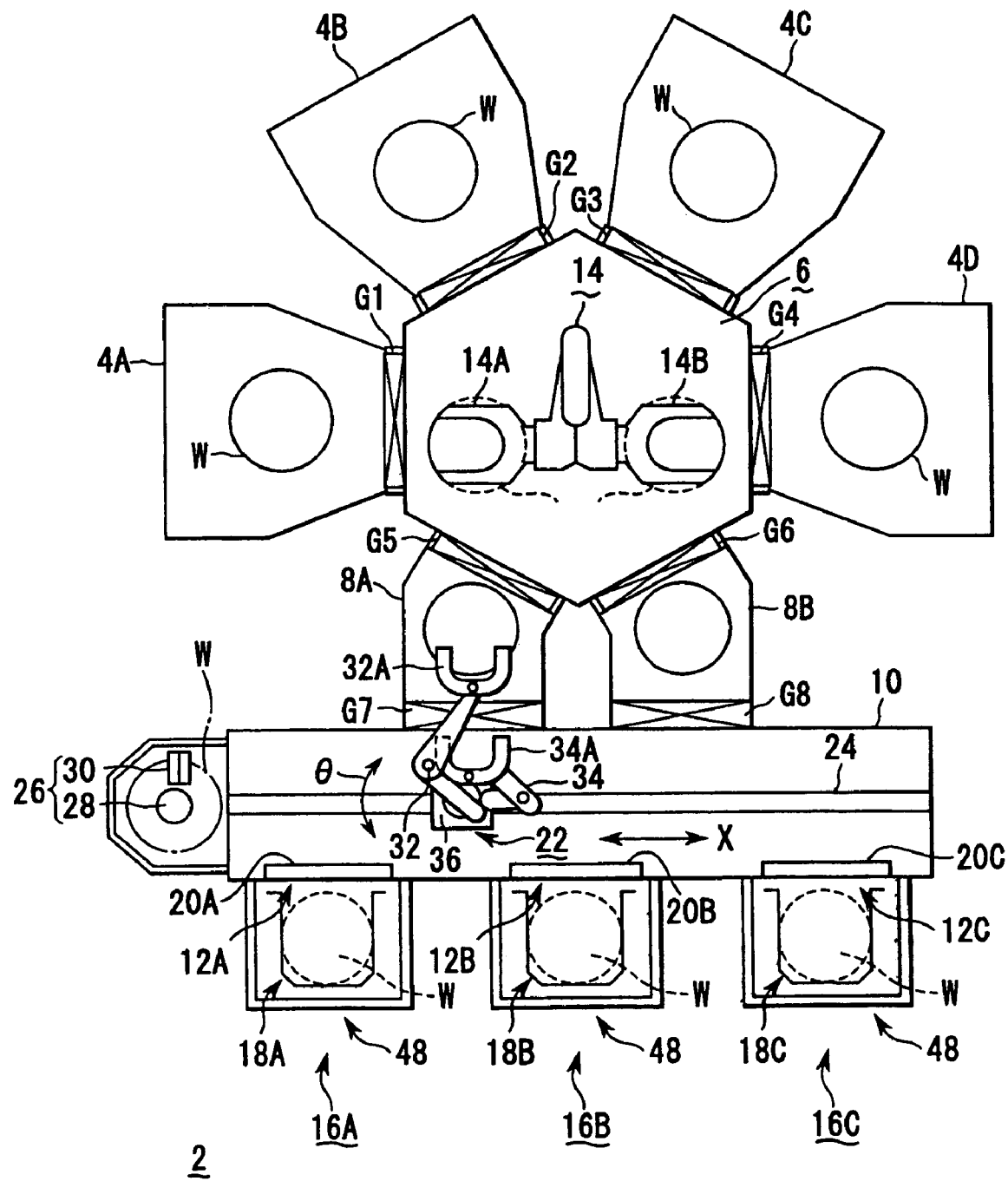
FIG. 1 is a schematic plan view showing a semiconductor processing system having a port structure in accordance with a preferred embodiment of the present invention.

Hereinafter, preferred embodiments of the present invention will be described. Further, like reference numerals will be given to like parts having substantially the same functions, and redundant description thereof will be provided only when necessary.

FIG. 1 is a schematic plan view showing a semiconductor processing system having a port structure in accordance with a preferred embodiment of the present invention.

As illustrated in FIG. 1, a processing system 2 has a plurality of, e.g., four, processing apparatuses 4A, 4B, 4C and 4D; an approximately hexagon shaped common transfer chamber 6; a first and a second load-lock chamber 8A and 8B having a load-lock function; and a narrow and long inlet side transfer chamber 10. The common transfer chamber 6 and the first and the second load-lock chamber 8A and 8B are evacuable and airtight chambers.

Specifically, each of the processing apparatuses 4A to 4D is connected to one of four sides of the approximately hexagon shaped common transfer chamber 6, and the first and the second load-lock chamber 8A and 8B are connected to other two sides thereof, respectively. In other words, the processing system 2 has a cluster tool type structure in which the processing apparatuses and the load-lock chambers are connected to the common transfer chamber 6, which is at a center thereof. The inlet side transfer chamber 10 is connected to both the first and the second load-lock chamber 8A and 8B. The processing apparatuses 4A to 4D and the first and the second load-lock chamber 8A and 8B are connected to the common transfer chamber 6 via airtightly openable/closable gate valves G1 to G4, G5 and G6, respectively. The first and the second load-lock chamber 8A and 8B are connected to the inlet side transfer chamber 10 via airtightly openable/closable gate valves G7 and G8, respectively.

The four processing apparatuses 4A to 4D are designed in a way that a same process or different processes are performed on a semiconductor wafer W as a substrate to be processed in a vacuum atmosphere. A first transfer unit 14 having stretchable, bendable, elevatable and revolvable multi-joint arms is provided at a position in an inner side of the common transfer chamber 6 such that the first transfer unit 14 can have an access therefrom to any of the two load-lock chambers 8A and 8B and the four processing apparatuses 4A to 4D. The first transfer unit 14 has two picks 14A and 14B that are independently stretchable and bendable in opposite directions and, thus, can carry two wafers at a time. Further, the first transfer unit 14 having a single pick can be used.

The inlet side transfer chamber 10 is of a horizontally lengthened box in which a downflow inert gas such as a $N_2$ gas or clean air circulates. Formed at one side of the horizontally lengthened box are a single or a plurality of ports (in this embodiment, three) 12A, 12B and 12C for loading and unloading the semiconductor wafer W as a substrate to be processed thereinto and therefrom. Port structures 16A, 16B, and 16C for wafer cassettes are disposed correspondingly to the ports 12A to 12C, respectively. Wafer cassettes 18A to 18C can be mounted on the port structures 16A, 16B and 16C, respectively.

Figure 2:
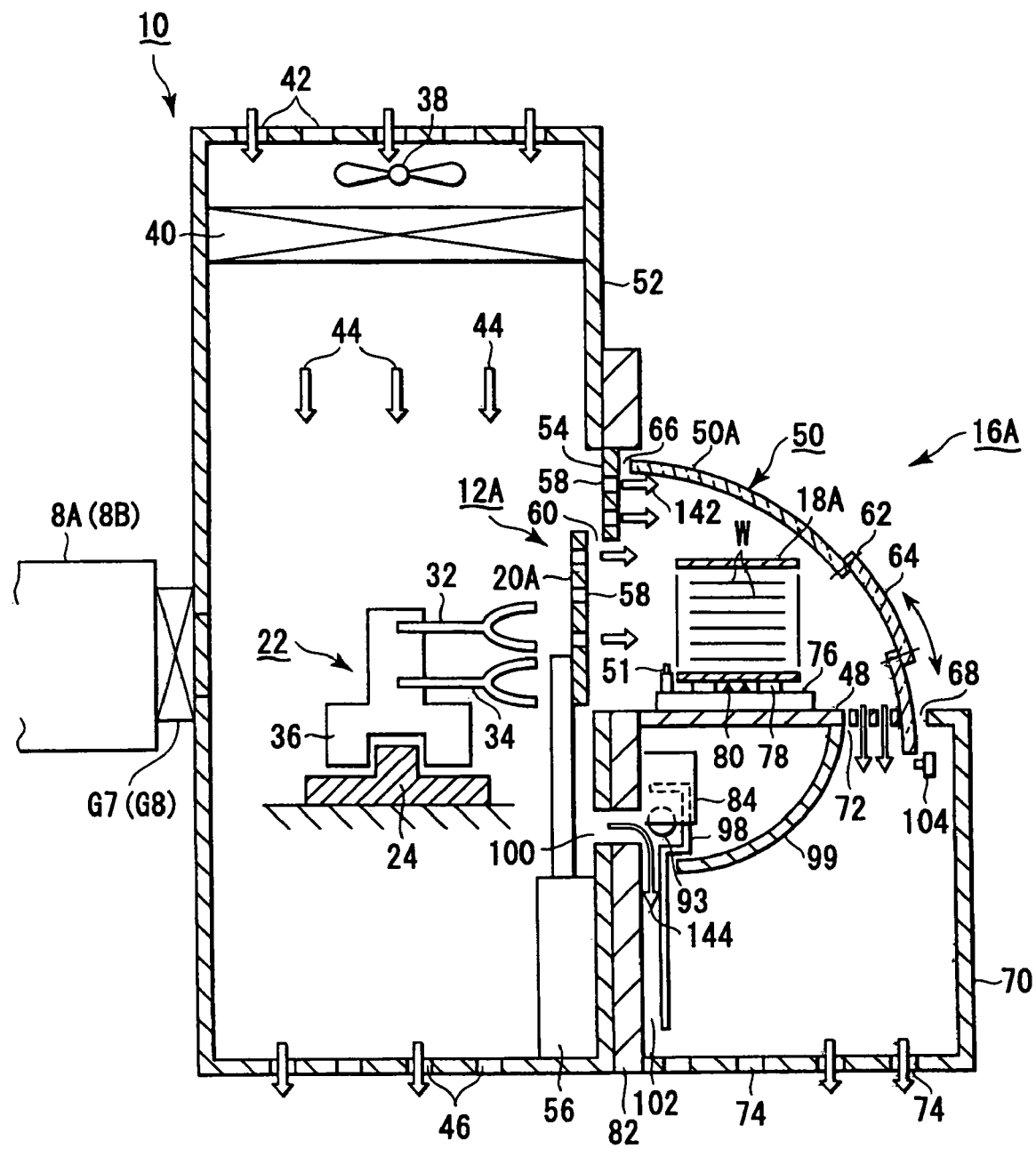
FIG. 2 shows a sectional view illustrating an inlet side transfer chamber of the processing system shown in FIG. 1 and a port structure attached thereto.
Figure 3A:
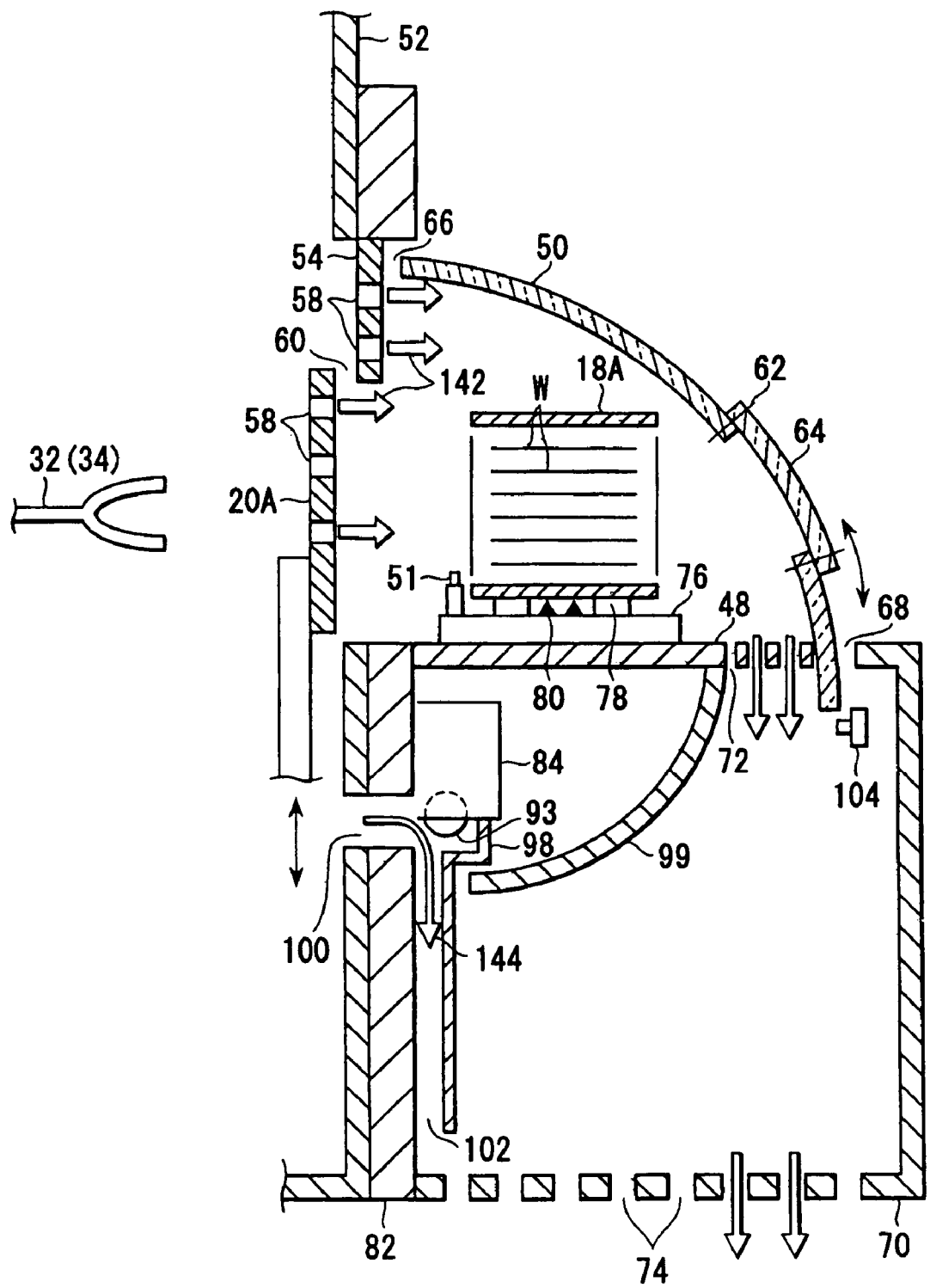
FIGS. 3A and 3B depict sectional views showing a state in which a hood is in a closed position in the port structure illustrated in FIG. 2.
Figure 3B:
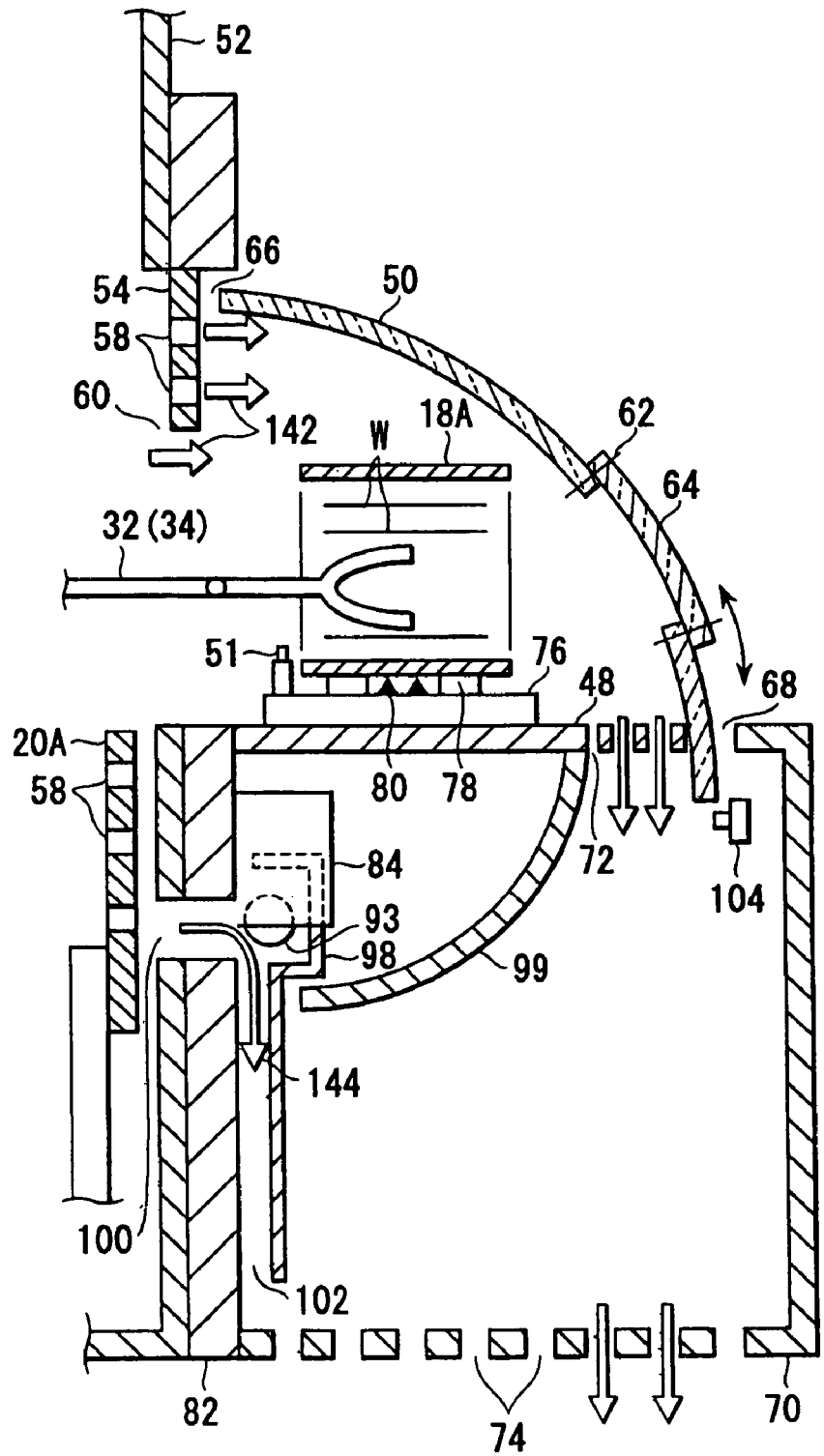
Figure 4:
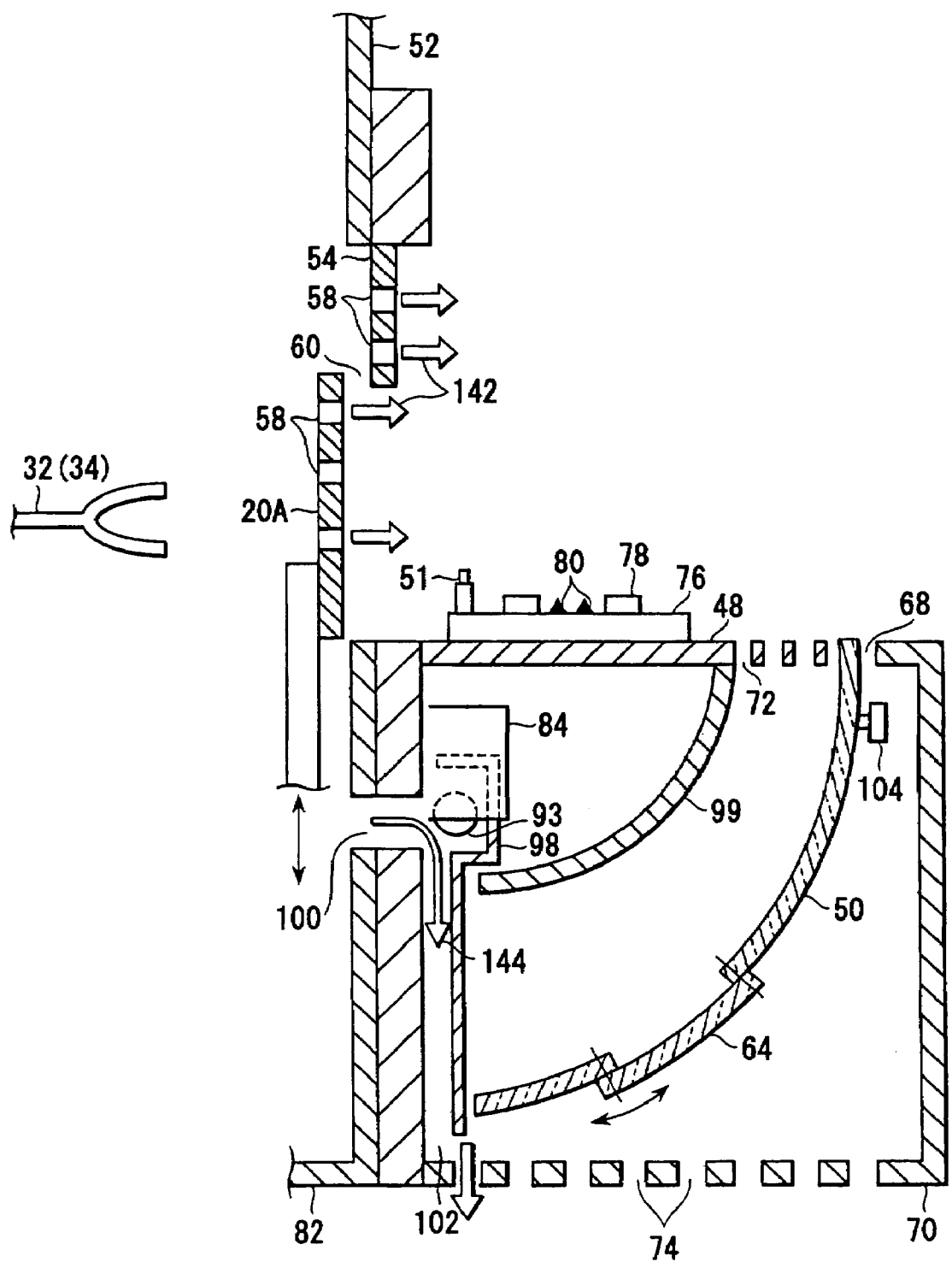
FIG. 4 provides a sectional view describing a state in which the hood is in an open position in the port structure illustrated in FIG. 2.

As shown in FIGS. 2 to 4, each of the cassettes 18A to 18C can accommodate therein a plurality of, e.g., 25, wafers W mounted in multi-levels at an equal pitch. An inside of each cassette 18A to 18C is of an open structure such that a gas can circulate. The wafer can be loaded into and unloaded from the inlet side transfer chamber 10 via sliding doors 20A, 20B and 20C disposed corresponding to the ports 12A to 12C, respectively.

Provided in the inlet side transfer chamber 10 is a second transfer unit 22 for transferring the wafer W in a length direction thereof. The second transfer unit 22 is slidably supported on a guide rail 24 extending in the length direction along a central portion of the inlet side transfer chamber 10. The guide rail 24 has therein, e.g., a linear motor as a moving mechanism, and the second transfer unit 22 moves along the guide rail 24 in an X direction by the linear motor.

Disposed at an end portion of the inlet side transfer chamber 10 is an orienter 26 as a positioning mechanism for performing a positioning of the wafer. The orienter 26 has a rotatable table 28 rotated by a driving motor (not shown) while having the wafer W mounted thereon. Provided at an outer circumferential portion of the rotatable table 28 is an optical sensor 30 for detecting a peripheral portion of the wafer W. The optical sensor 30 detects a location/direction or a misalignment of a notch or an orientation flat of the wafer W.

The second transfer unit 22 has two multi-joint shaped transfer arms 32 and 34 installed in two vertical steps. Bifurcated picks 32A and 34A are attached to leading ends of the transfer arms 32 and 34, respectively, and a wafer W is directly held on each of the picks 32A and 34A. Each of the transfer arms 32 and 34 is stretchable and bendable in a radial direction, i.e., R direction and the stretching and bending of the transfer arms 32 and 34 can be individually controlled. Further, the transfer arms 32 and 34 can be rotatable as a single body in a θ direction, i.e., a revolving direction relative to a base 36.

FIG. 2 shows a sectional view illustrating the inlet side transfer chamber 10 of the processing system shown in FIG. 1 and the port structure 16A attached thereto. As shown in FIG. 2, installed at a ceiling portion of the inlet side transfer chamber 10 are a blow fan 38 and a filter 40 having, e.g., a ULPA (ultra low penetration air) filter. A clean gas supplied from ventholes 42 formed on a ceiling plate passes through the filter 40 and then constantly forms a downflow 44 cleanly maintained in the inlet side transfer chamber 10. The downflow 44 is downwardly discharged through ventholes 46 provided at a bottom plate of the inlet side transfer chamber 10 to outside of the facility. In this case, an inside of the inlet side transfer chamber 10 is set to be in a state of a positive pressure slightly higher than an outer atmospheric pressure by, e.g., 1.3 Pa.

Hereinafter, the port structures 16A to 16C disposed respectively to the ports 12A to 12C of the inlet side transfer chamber 10 will be described. Since the three port structures 16A to 16C have a same structure, a single port structure, e.g., the port structure 16A as an example will be described herein. Schematically, the port structure 16A includes the sliding door 20A installed at the port 12A; a table 48 for mounting thereon the cassette 18A; and a hood 50 rotatably installed to fully cover the cassette 18A and the port 12A.

Figure 5A:
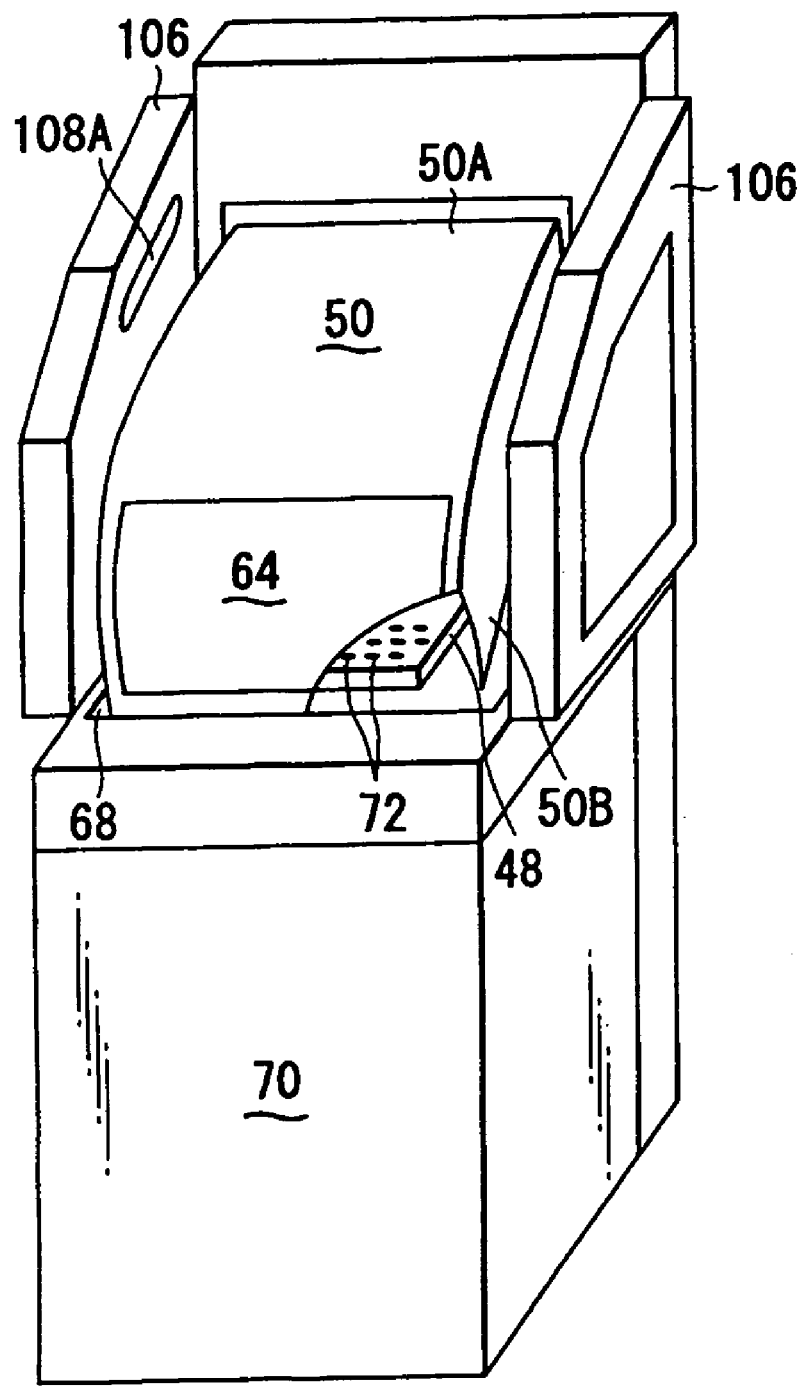
FIGS. 5A to 5C present perspective views explaining an opening/closing operation of the hood in the port structure shown in FIG. 2.
Figure 5B:
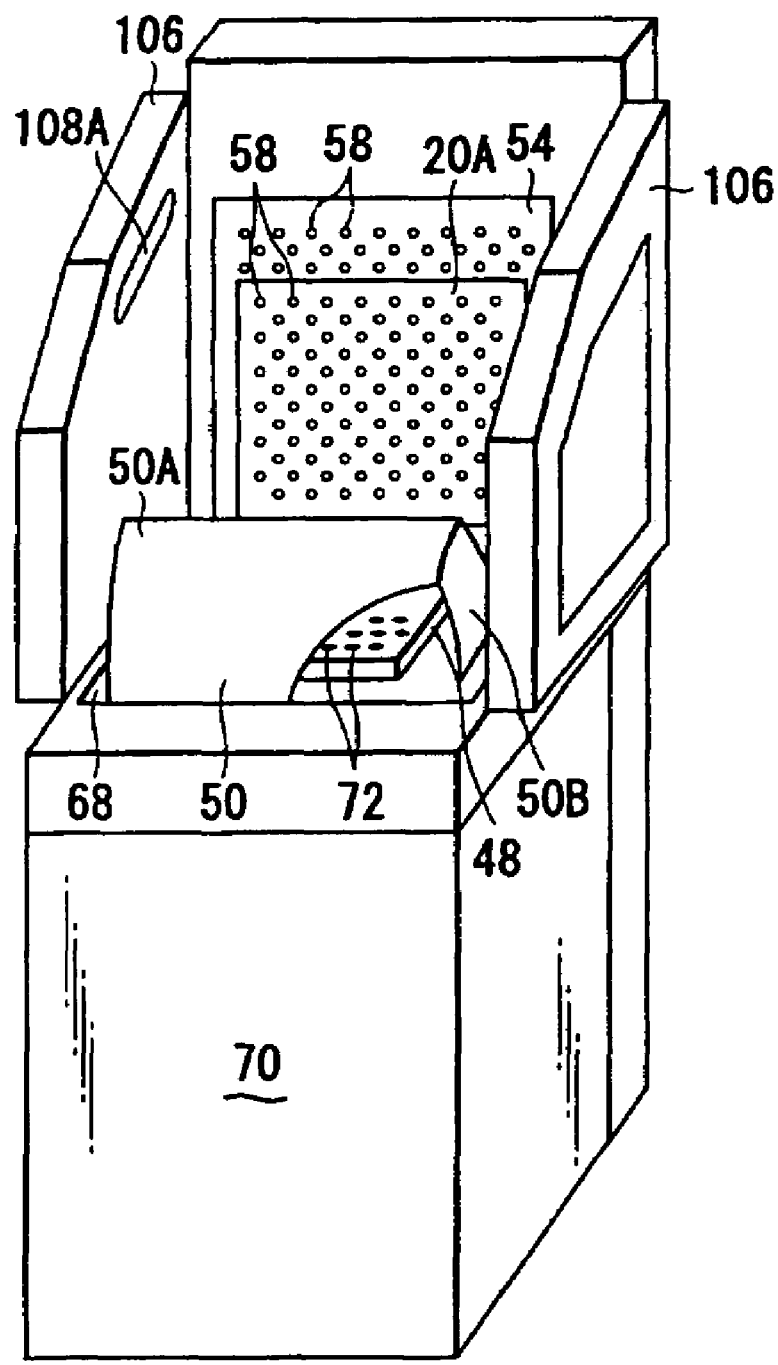
Figure 5C:
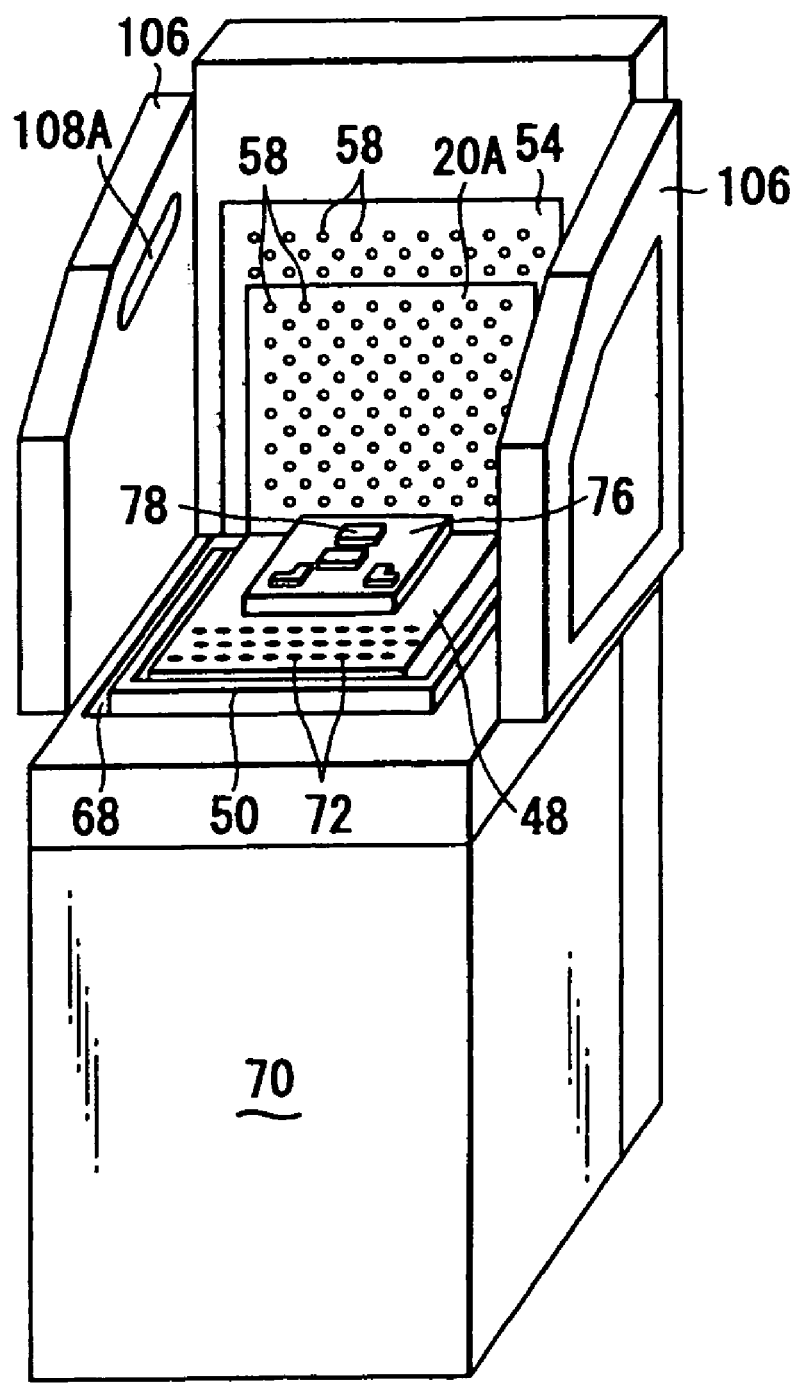
Figure 6:
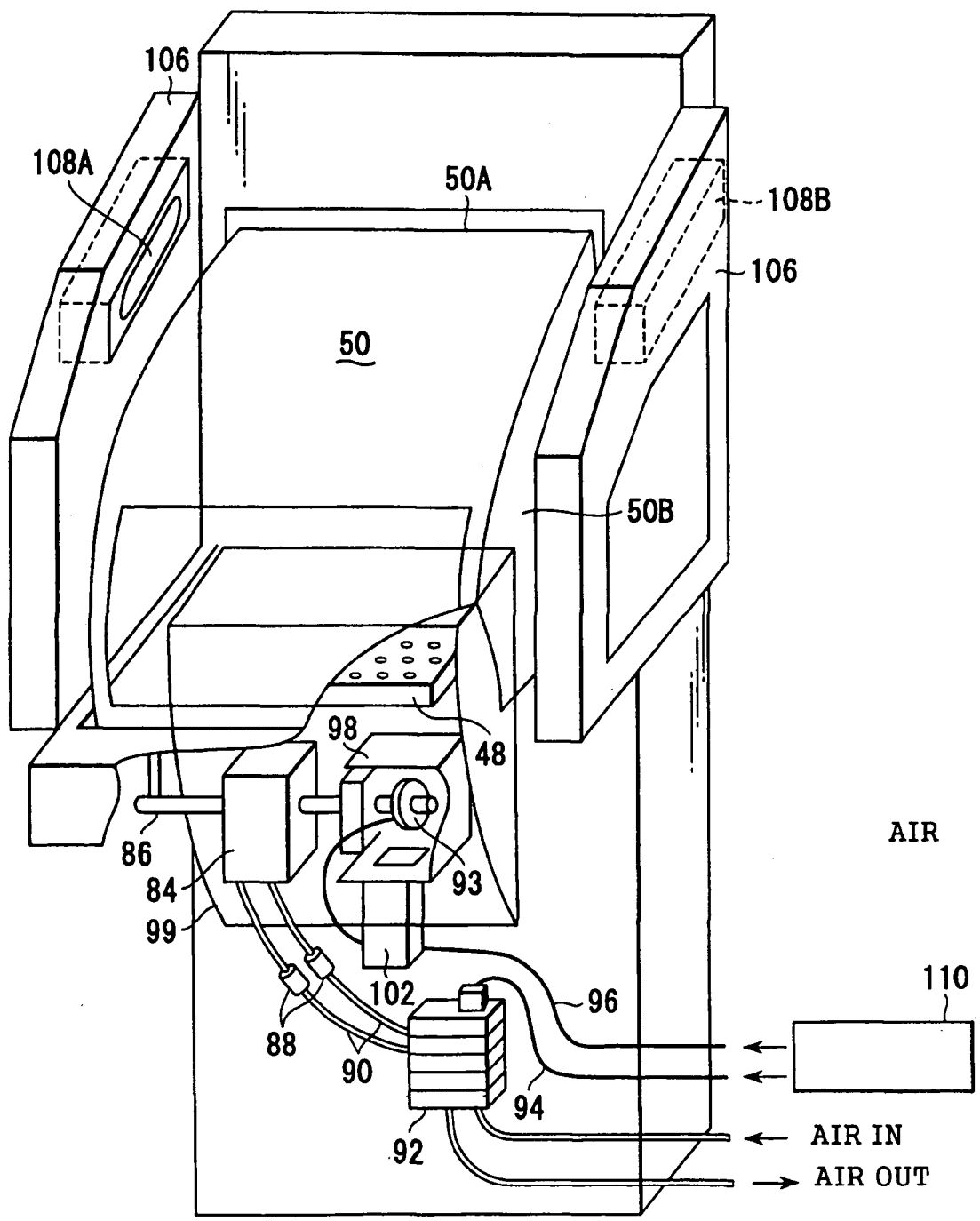
FIG. 6 represents a partially exploded perspective view depicting an inside of the port structure illustrated in FIG. 2.

FIGS. 3A and 3B depict sectional views showing a state in which the hood 50 is in a closed position in the port structure 16A; FIG. 4 provides a sectional view describing a state in which the hood 50 is in an open position in the port structure 16A; FIGS. 5A to 5C present perspective views explaining an opening/closing operation of the hood 50 in the port structure 16A; FIG. 6 represents a partially exploded perspective view depicting an inside of the port structure 16A.

As illustrated in FIGS. 2 to 4, the port 12A is formed by opening a front panel 52 of the inlet side transfer chamber 10 in an approximately quadrangular shape. Disposed at an upper portion of the port 12A is a narrow and long additional panel 54 made of, e.g., aluminum plate for dividing the port 12A. The sliding door 20A for opening and closing the port 12A is slidably installed inside the port 12A. The sliding door 20A vertically moves by an elevation mechanism 56 provided at a lower portion of the port 12A. The sliding door 20A is formed in a shape of a thin plate made of, e.g., aluminum.

Formed on an almost entire surface of the sliding door 20A and the additional panel 54 is a plurality of first ventholes 58 having a diameter of, e.g., about 4 mm. A gas of a high level of cleanliness in the inlet side transfer chamber 10 is introduced into the hood 50 in the closed position via the first ventholes 58. The first ventholes 58 may be formed on at least one of the sliding door 20A and the additional panel 54 but preferably on the sliding door 20A in order to pass the gas of a high level of cleanliness through the cassette 18A as well.

Not just for an open state and a closed state, the sliding door 20A always maintains a noncontact state with the additional panel 54 or the front panel 52. In case of the closed state, a narrow gap 60 in the range from about 0.5 to 1.0 mm is secured between the sliding door 20A and the additional panel 54. Thus, since the sliding door 20A is kept in the noncontact state, particles can be prevented from being generated.

The table 48 is installed at an outside of the front panel 52 toward the port 12A, and a mount region for mounting the wafer cassette 18A is formed thereabove. The table 48 is formed of a rectangular top plate of a supporting housing 70 made of stainless, and a space surrounded by walls of the supporting housing 70 is formed under the table 48.

A platform 76 forming a cassette mounting region is disposed on the table 48, specifically, at an approximately central portion of a horizontal direction thereof and near the port 12A. Disposed on a surface of the platform 76 is a plurality of, e.g., four, positioning blocks 78 for performing a positioning when the cassette 18A is mounted thereon (see FIG. 5). Provided on the platform 76 is a leveling screw (not illustrated) for controlling the top surface to be horizontal.

Disposed at a central portion of the platform 76 is a cassette sensor 80 (see FIGS. 3A and 3B) for detecting whether or not there exists the cassette 18A. Provided at an end portion of the platform 76 at the port 12A side is a wafer sensor 51 having an optical sensor for transmitting and receiving light. The wafer sensor 51 detects whether or not the wafer W is ejected from the cassette 18A mounted on the table 48.

The hood 50 is rotatably supported at the supporting housing 70 to be in a closed position and an open position. The hood 50 in the closed position forms a closed space surrounding the platform 76 (cassette mounting region) and the port 12A together with the front panel 52, the additional panel 54 and the table. The closed space is of a size that can accommodate the cassette 18A mounted on the platform 76. The hood 50 in the open position exposes the platform 76.

The entire hood 50 is made of a transparent material, e.g., anti-static, transparent polycarbonate resin. As illustrated in FIGS. 5A to 5C, the hood 50 includes an approximately 90 degrees arc shaped front plate 50A and fan shaped side plates 50B at both sides thereof. An approximately quadrangular shaped window 64 for maintenance is detachably attached to the front plate 50A by screws 62 (see FIGS. 3A and 3B). By separating the window 64 from the front plate 50A, maintenance for an inner surface of the hood 50 can be performed without removing the hood 50 from the supporting housing 70.

Formed at the table 48 is a U-shaped slit 68 for passing the hood 50 therethrough when the hood 50 rotates. The hood 50 vertically rotates after passing through the slit 68 without being in contact therewith. Further, in the closed position, a leading end portion of the hood 50 is in the noncontact state with an opposing portion (the additional panel 54 in this embodiment). In other words, a gap 66 of, e.g., a few mm, is formed between the leading end portion of the hood 50 and the additional panel 54. Due to such configuration, it is possible to prevent particles from being generated by a contact between members.

A plurality of second ventholes 72, each having a diameter of, e.g., about 4 mm, is formed between the platform 76 and the slit 68 on the table 48. Further, ventholes 74 are formed at a bottom portion of the supporting housing 70. As described above, a clean gas in the inlet side transfer chamber 10 is introduced into the closed space inside the closed hood 50 through the first ventholes 58. The clean gas introduced into the closed space passes through the cassette 18A on the platform 76 and then flows into the supporting housing 70 under the table 48 through the second ventholes 72. Thereafter, the clean gas is discharged through the ventholes 74 formed at the bottom portion of the supporting housing 70 to an outside of a facility.

As illustrated in FIGS. 2 to 4 and FIG. 6, a driving unit 84 for operating the hood 50 is attached to a side plate 82 of the port 12A side of the supporting housing 70 under the table 48. The driving unit 84 includes an actuator, e.g., a rotary cylinder operated by compressed air, and rotates a driving axis 86 forwardly and reversely. Further, a link mechanism connected to the driving axis 86 will be described later. A solenoid valve 92 is connected to the driving unit 84 via an air tube 90 (see FIG. 6) in which a speed controller 88 as an air flow controller is installed. A control signal from a host computer 110 is inputted into the solenoid valve 92 via a cable 94. By switching the solenoid valve 92 under a control of the host computer 110, the compressed air is selectively introduced into and discharged from the driving unit 84. Further, the host computer 110 monitors and controls an entire operation of a semiconductor processing system.

Provided at the driving axis 86 is a break 93 having, e.g., an electronic break. The break 93 is controlled by a control signal inputted via a cable 96. The control signal is inputted from, e.g., the host computer 110 serving as a break controller.

A box-shaped break cover 98 is provided to cover the entire break 93. A venthole 100 is formed at the side plate 82 (see FIG. 2) and the front panel 52, which is open to communicate with inside of the break cover 98. Further, formed at a lower portion of the break cover 98 is a gas channel 102 communicating with an inside of the supporting housing 70. The clean gas in the inlet side transfer chamber 10 is introduced into the break cover 98 through the venthole 100 and discharged therefrom through the gas channel 102. By passing the clean gas through the break cover 98, particles generated therein are discharged downwardly. Further, since the gas channel 102 is positioned below a lower portion of the hood 50 in an open position (see FIG. 4), particles generated from the break 93 are not adhered to the inner surface of the hood 50.

An arc-shaped driving unit cover 99, the arc having an opening angle of about 90 degrees, is installed in the supporting housing 70 to fully cover the driving unit 84 and the break cover 98. An upper portion of the driving unit cover 99 is fixedly attached to a backside of the table 48. A lower portion of the driving unit cover 99 is downwardly open so that particles can be discharged downwardly. The aforementioned second ventholes 72 formed on the table 48 are provided between a portion attached to the driving unit cover 99 and the slit 68 for allowing the hood 50 to pass therethrough (see FIG. 4).

As depicted in FIG. 2, a micro switch 104 is provided at a position slightly below a lower portion of the hood 50 when the hood 50 is in the closed position in the supporting housing 70. The micro switch 104 is used for checking whether or not the hood 50 is in the closed position.

As illustrated in FIGS. 5A to 6, a pair of protection plates 106 is provided at both sides of the table 48 to cover both sides of the hood 50 in the closed position while having narrow gaps therebetween. In order to prevent an operator from putting a hand and the like between the hood 50 and the protection plates 106, following safety measures are performed. In other words, as illustrated in FIG. 6 and the like, a line-shaped light transmitting part 108A and a line-shaped light receiving part 108B facing each other are provided at the pair of protection plates 106, respectively. The light transmitting part 108A and the light receiving part 108B included in an obstacle sensor 108 immediately stop a rotation of the hood 50 by operating the break 93 when an obstacle (e.g., a hand of an operator and the like) is detected during a closing operation of the hood 50.

FIGS. 7A to 7D offer diagrams for explaining operations of the driving unit 84 and the break 93 when the hood 50 is opened or closed in the port structure 16A. The host computer 110 switches a port of compressed air of the solenoid valve 92 in accordance with a process sequence, thereby switching the compressed air with respect to the driving unit 84 of the hood 50. In this case, as illustrated in this example, there are provided three switching types of the port, i.e., a closing operation, an opening operation and maintenance of status quo. Further, when a signal for indicating a presence of an obstacle is received from the obstacle sensor 108, the host computer 110 also serving as the break controller operates the break 93. A detailed description of such operation will be followed later.

Figure 8:
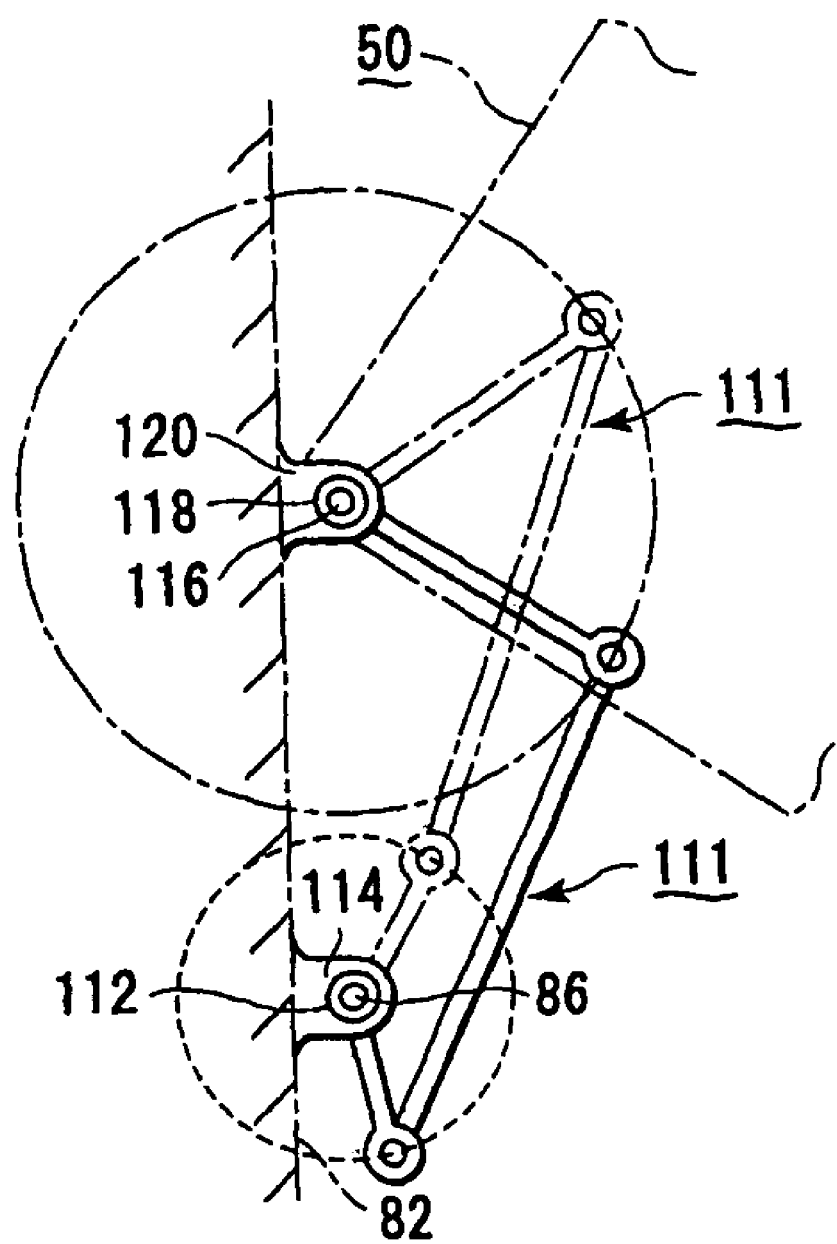
FIG. 8 is a side view showing a link mechanism for opening and closing the hood in the port structure shown in FIG. 2.
Figure 9A:
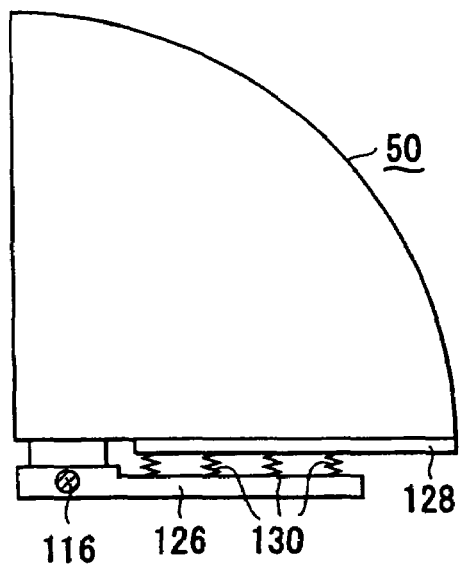
FIGS. 9A and 9B respectively provide a side view and a vertical rear view showing a structure of a portion attached to the hood and a rotation axis thereof in the port structure illustrated in FIG. 2.
Figure 9B:
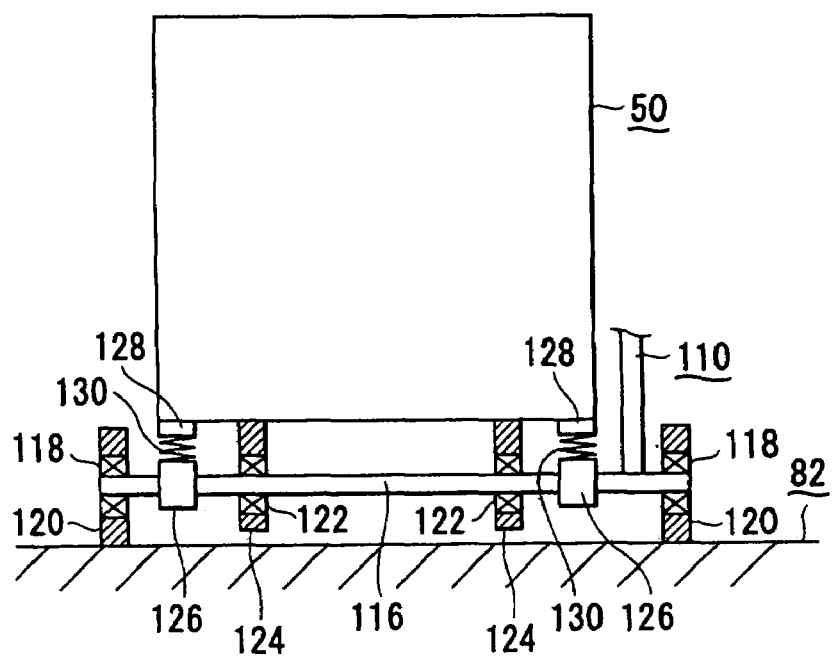

FIG. 8 is a side view showing a link mechanism for opening and closing the hood in the port structure shown in FIG. 2. FIGS. 9A and 9B respectively provide a side view and a vertical rear view showing a structure of a portion attached to the hood and its rotation axis in the port structure illustrated in FIG. 2. With reference to FIGS. 8 to 9B, structures of a link mechanism 111 for transferring a rotational driving force to the hood 50 and the portion attached to the hood 50 will be described.

As illustrated in FIG. 8, the driving axis 86 (see FIG. 6) connected to the driving unit 84 is rotatably supported at the side plate 82 via bearings 112 and fixed members 114. In the same way, a rotational axis 116 supporting the hood 50 is rotatably supported at the side plate 82 via bearings 118 and fixed members 120 (see FIGS. 8 and 9B). The link mechanism 111 is installed so as to connect the driving axis 86 with the rotation axis 116. The link mechanism 111 transfers the rotational driving force of the driving axis 86 to the rotation axis 116.

As shown in FIGS. 9A and 9B, the hood 50 is rotatably attached to the rotation axis 116 via a pair of the bearings 122 and a pair of the fixed members 124 fixed on an angled portion of the hood 50. Fixed on the rotation axis 116 is a pair of rotation arms 126 extending along both sides of both end portions of the hood 50 while having gaps therebetween. In other words, the rotation arms 126 and the rotational axis 116 rotate together as a single body.

A pair of gusset plates 128 is fixed on the hood 50 to face each other at an opposing position to the rotation arms 126. Resilient members 130 including a plurality of coil springs having a length of, e.g., about 45 mm are disposed between the gusset plates 128 and the rotation arms 126. In case an external force is applied to the hood 50, a distance between the gusset plates 128 and the rotation arms 126 can be slightly shortened by a stroke compressing the resilient members 130. In other words, the hood 50 can rotate toward the rotation arm 126 by as much as the stroke.

Hereinafter, a schematic flow of the wafer W in an operation of the semiconductor processing system illustrated in FIG. 1 will be described.

First, the cassette 18A accommodating therein unprocessed semiconductor wafers W is mounted on the table 48 in one of the three port structures 16A to 16C, e.g., the port structure 16A. Thereafter, the hood 50 is automatically operated toward a closing direction to cover the entire cassette 18A. Next, the sliding door 20A that is closing the port 12A is opened to unload an unprocessed wafer W from the cassette 18A. At this time, by operating one transfer arm of the second transfer unit 22, e.g., the transfer arm 32, the pick 32A receives and holds the wafer W from the cassette container 18C. Then, by moving the second transfer unit 22 in X direction, the wafer W is transferred to the orienter 26.

Thereafter, an unprocessed wafer W, which is previously arranged in position in the orienter 26, is unloaded from the rotatable table 28 to empty the rotatable table 28. To do so, the other empty transfer arm 34 is operated so that the pick 34A receives and holds the wafer W from the rotatable table 28.

Next, the unprocessed wafer, which is held by the pick 32A of the transfer arm 32, is mounted on the empty rotatable table 28. The wafer is positioned until another unprocessed wafer is transferred. Thereafter, the unprocessed wafer, which is unloaded from the rotatable table 28 to the other transfer arm 34, is moved to one of the two load-lock chambers 8A and 8B, e.g., the load-lock chamber 8A, by moving the second transfer unit 22 in the X direction.

Then, the load-lock chamber 8A whose inner pressure is already controlled is opened by opening a gate valve G7. Further, a processed wafer on which a predetermined process, e.g., a film forming process, an etching process or the like, has been performed in the processing apparatus is supported while waiting in the load-lock chamber 8A.

Thereafter, by operating the empty transfer arm 32, the processed wafer W waiting in the load-lock chamber 8A is unloaded by the pick 32A. Next, by operating the other transfer arm 34, the unprocessed wafer W, which is held by the pick 34A, is loaded into the load-lock chamber 8A. Then, the processed wafer is restored to a primary cassette by the second transfer unit 22.

Meanwhile, after the unprocessed wafer Wd is loaded into the load-lock chamber 8A, the load-lock chamber 8A is airtightly sealed by closing the gate valve G7. Next, after a pressure is controlled by evacuating an inside of the load-lock chamber 8A, the load-lock chamber 8A is made to communicate with the common transfer chamber 6 with a vacuum atmosphere already formed therein by opening the gate valve G7. Then, the unprocessed wafer W is loaded into the common transfer chamber 6 by the first transfer unit 14. Since the first transfer unit 14 has the two picks 14A and 14B, in case the first transfer unit 14 holds a processed wafer, the processed wafer is exchanged for an unprocessed wafer.

Next, required processes are sequentially performed on the unprocessed wafer W in, e.g., each of the processing apparatuses 4A to 4D. When all the required processes are completed, the processed wafer W is restored to a primary cassette along the same path as described above in a reverse sequence. In this case, the processed wafer W can pass through either one of the two load-lock chambers 8A and 8B.

Hereinafter, a specific operation in the port structure 16A will be described with reference to FIGS. 10A to 10J. FIGS. 10A to 10J offer diagrams for schematically explaining an operational relationship between the sliding door 20A and the hood 50 in the port structure 16A.

Figure 10A:
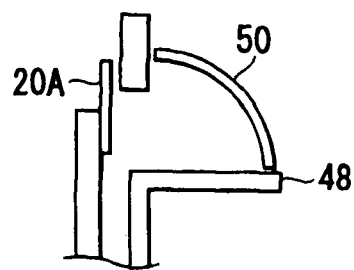
FIGS. 10A to 10J offer diagrams for schematically explaining an operational relationship between a sliding door and the hood in the port structure illustrated in FIG. 2.
Figure 10B:
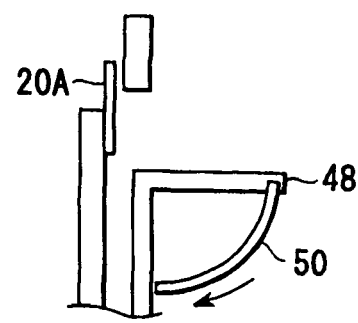
Figure 10C:
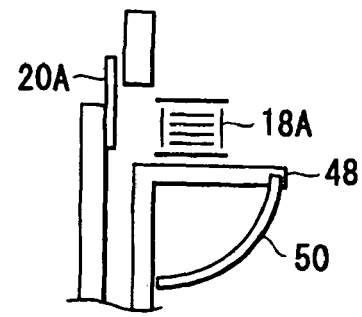

First, in an initial state, both the sliding door 20A and the hood 50 are in a closed state, as illustrated in FIG. 10A. Then, when the cassette 18A accommodating therein unprocessed wafers W is transferred thereto, the hood 50 rotates approximately 90 degrees to thereby be located under the table 48, as illustrated in FIG. 10B. Thereafter, as illustrated in FIG. 10C, the cassette 18A is installed on the table 48.

Figure 10D:
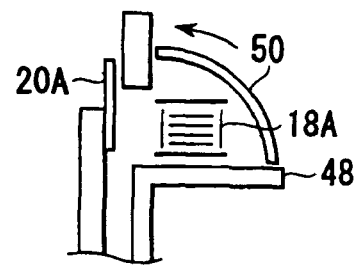
Figure 10E:
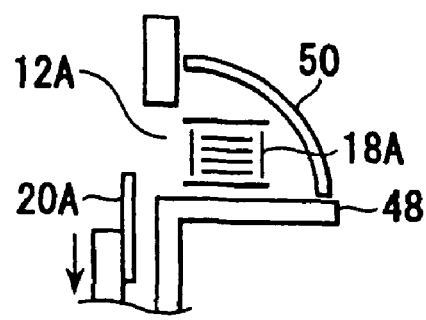
Figure 10F:
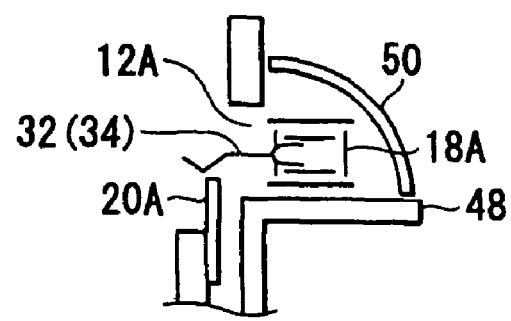
Figure 10G:
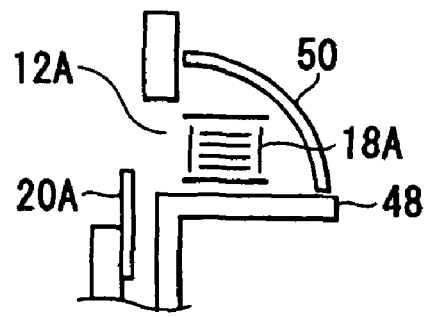

After the cassette 18A is completely installed, the hood 50 is rotated back approximately 90 degrees to cover the entire cassette 18A, as illustrated in FIG. 10D. Next, as shown in FIG. 10E, the sliding door 20A is lowered to open the port 12A. Then, as depicted in FIG. 10F, the unprocessed wafers W are sequentially loaded into a processing system via the open port 12A by using the transfer arm 32(34) to thereby start a process. At this time, the unprocessed wafers are sequentially received while the progress of the processing on a previously received wafer being monitored to check for its completion. A processed wafer is restored into the primary cassette 18A. During that time, an open state of the port 12A is maintained with the sliding door 20A being lowered, as illustrated in FIG. 10G.

Figure 10H:
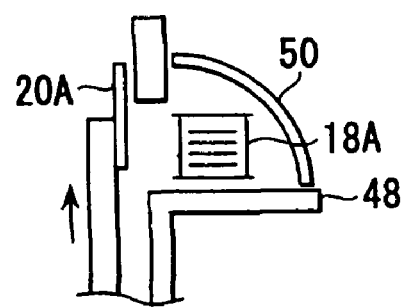
Figure 10I:
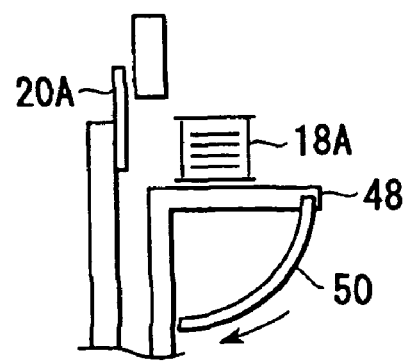
Figure 10J:
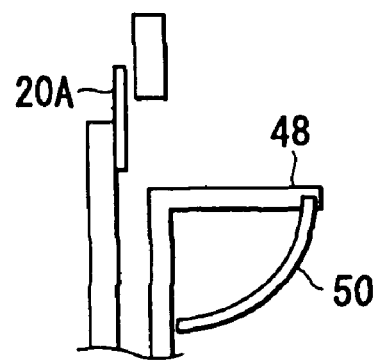

After the process for every wafer W in the cassette 18A is completed, the port 12A is closed by raising the sliding door 20A, as illustrated in FIG. 10H. Next, as illustrated in FIG. 10I, the hood 50 covering the cassette 18A rotates approximately 90 degrees in the opening direction again to be located under the table 48. Further, as illustrated in FIG. 10J, the cassette 18A accommodating therein the processed wafers W is unloaded from the table 48 for a following process. Thereafter, the hood 50 is closed and then returned to a primary state illustrated in FIG. 10A. Further, in this state, a next cassette accommodating therein unprocessed wafers is expected to be loaded.

While the above-described operations are performed, clean air maintained at a predetermined level of cleanliness forms a downflow in a facility in which the processing system 2 is installed, as illustrated in FIGS. 2 to 4. Moreover, in the inlet side transfer chamber 10, the clean gas (clean air) sent to the blow fan 38 passes through the filter 40 and forms a downflow illustrated by arrow 44 of FIG. 2. By passing through the filter 40, the clean gas becomes a clean gas having a higher level of cleanliness than outside air. Such downflow is discharged from a floor portion as a facility exhaust.

As a result, an inside of the inlet side transfer chamber 10 is in a state of a positive pressure higher than an outer atmospheric pressure by, e.g., 1.3 Pa. Therefore, in case the sliding door 20A is closed, as illustrated in FIGS. 2 and 3A, a clean gas having a high level of cleanliness constantly flows into the hood 50 via the first ventholes 58 formed at the sliding door 20A and the additional panel 54, as illustrated by arrow 142. Further, in case the sliding door 20A is opened, as illustrated in FIG. 3B, the clean gas having the high level of cleanliness constantly flows into the hood 50 via the port 12A or the first ventholes 58 formed at the additional panel 54, as illustrated by the arrow 142.

Such clean gas introduced into the closed space in the hood 50 directly passes through the cassette 18A on the platform 76. Thereafter, the clean gas flows into the supporting housing 70 under the table 48 via the second ventholes 72 and then is discharged through a bottom portion of the supporting housing 70 to an outside of the system. Accordingly, an atmosphere of the clean gas is maintained in the hood 50 or the cassette 18A and, further, a stagnation of an atmospheric gas is prevented by the constantly introduced clean gas. As a result, a possibility of contaminating the wafer with particles is decreased. Besides, an inside of the hood 50 is in a state with a positive pressure in comparison with an outer atmospheric pressure. Thus, even if the gap 66 exists between the additional panel 54 and the hood 50, outside clean air cannot enter into the inside of the hood 50.

The gap 66 is formed between the additional panel 54 and the hood 50 in the closed state and, further, the slit 68 is set to have a size to prevent the contact with the hood 50. Accordingly, it is possible to prevent particles themselves from being generated due to a contact between members. Further, the driving unit 84 under the table 48 is covered with the driving unit cover 99. Therefore, the particles generated therefrom are not scattered and can be downwardly discharged with the flow of the clean gas through a lower opening of the driving unit cover 99.

In addition, the break 93 is covered with the break cover 98. Further, the clean air in the inlet side transfer chamber 10 is introduced into the break cover 98 via the ventholes 100 and discharged through the gas channel 102. Although a large amount of particles are generated from the break 93 for stopping a rotation of the hood 50, such particles can be forced to be discharged downwardly without being scattered due to the above-described configuration. Accordingly, the wafer W can be prevented from being contaminated with the particles. Further, since the gas channel 102 is positioned under a lower portion of the hood 50 in the open position (see FIG. 4), particles generated from the break 93 are not adhered to the inner surface of the hood 50.

A cassette sensor 80 (see FIG. 4) is provided at the platform 76 of the table 48. Therefore, it is possible to detect whether or not the cassette 18A is properly mounted thereon. Furthermore, a wafer sensor 51 is installed at an end portion of the platform 76 at the port 12A side. Accordingly, it is possible to detect whether the wafer W is ejected from the cassette 18A installed on the table 48 (see FIG. 2).

Since a mountable and detachable window 64 is provided at the hood 50, a maintenance work for the inner surface of the hood 50 can be performed by separating the window 64 therefrom when necessary. Further, the hood 50 is transparent and, thus, it is possible to observe a state of the cassette 18A or a transfer state of the wafer W.

As described in FIGS. 6 and 7A to 7D, a rotation of the hood 50 is carried out by supplying compressed air toward the driving unit 84. At this time, a supply or an exhaust of the compressed air is carried out by switching the solenoid valve 92 in accordance with an instruction from the host computer 110. In case of a port position of the solenoid valve 92 illustrated in FIG. 7A, the hood 50 rotates in a closing direction. Further, in case of the port position of the solenoid valve 92 illustrated in FIG. 7D, the hood 50 rotates in the open direction.

Figure 7A:
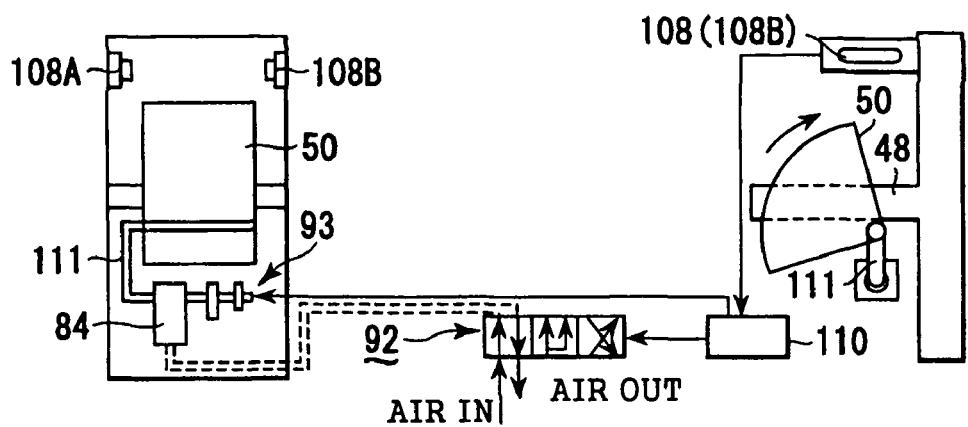
FIGS. 7A to 7D offer diagrams for explaining an operation of a driving unit or a break when the hood is opened or closed in the port structure illustrated in FIG. 2.
Figure 7B:
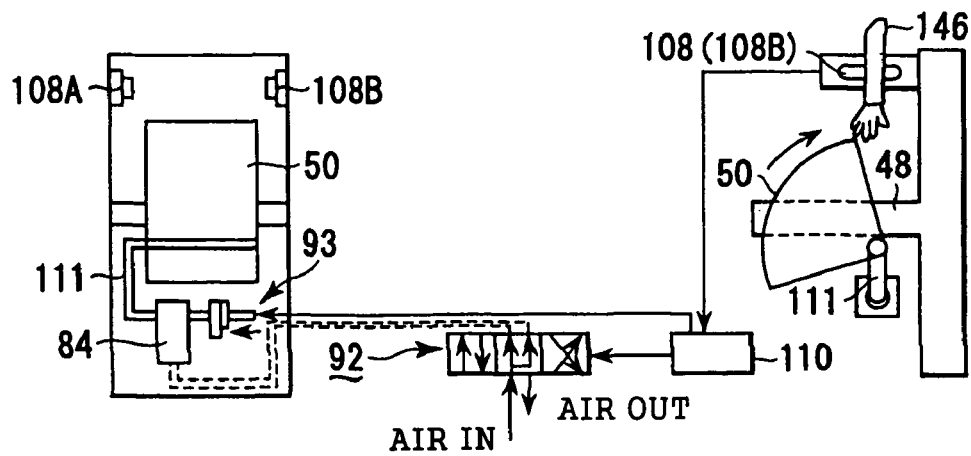

It is assumed that, for example, an operator puts by mistake an obstacle 146 such as a hand and the like toward the table 48 when the hood 50 rotates in the closing direction as illustrated in FIG. 7B. In that case, the sensor 108 detects the presence of the obstacle 146, and the host computer 110 immediately operates the break 93 in response to the detection result to immediately stop the rotation of the hood 50. Accordingly, it is possible to improve a safety for the operator and the like. Further, while operating the break 93, the host computer 110 converts the port of the solenoid valve 92 into a neutral port (port for maintaining a current state position), as illustrated in FIG. 7B. Accordingly, the driving unit (air cylinder) 84 is simultaneously supplied with compressed air for rotating the hood 50 in the open direction and that for rotating the hood 50 in the closing direction.

Figure 7C:
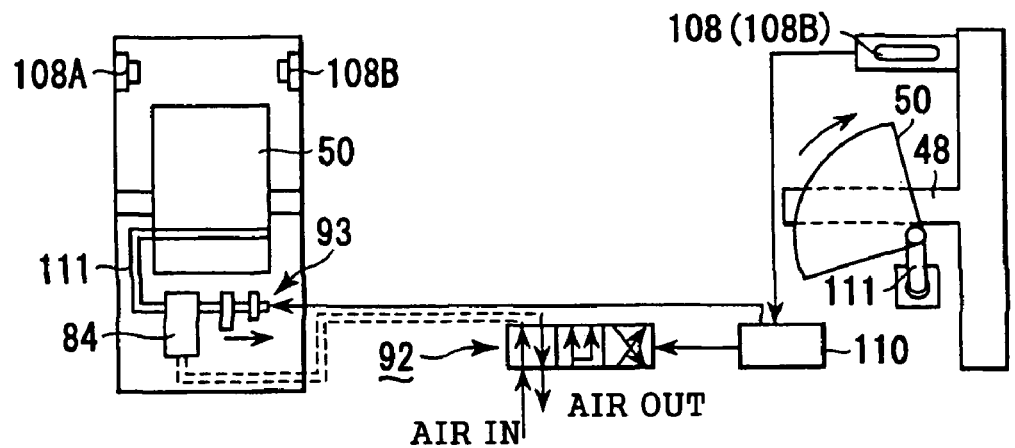
Figure 7D:
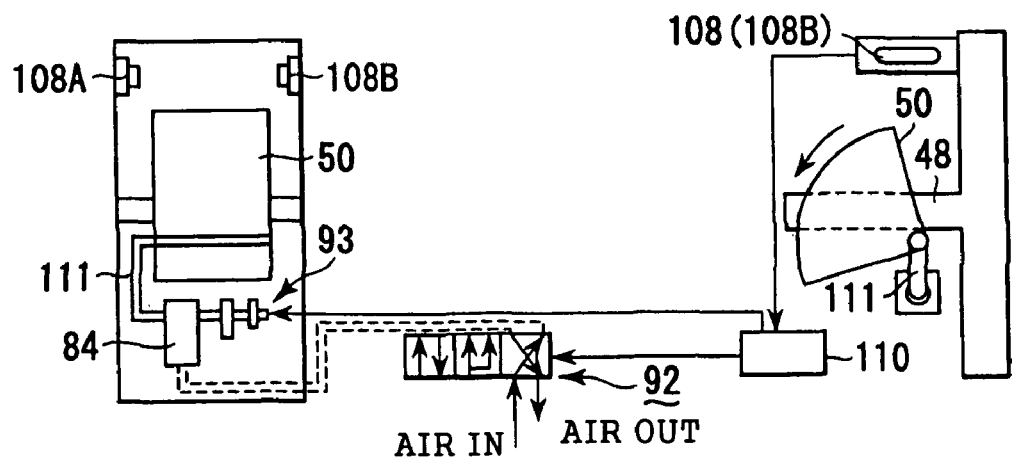

When the compressed air is applied to the driving unit 84 in both directions, as shown in FIG. 7C, although the break 93 is released after removal of the obstacle 146 and the hood 50 starts to rotate in the closing direction, the hood 50 does not rapidly rotate at a high speed. In this case, the hood 50 usually starts to rotate at a low speed equal to the speed at the time the rotation in the closing direction is stopped and, accordingly, safety problem is not an issue.

On the contrary, in case the obstacle 146 is detected, if the port position of the solenoid valve 92 shown in FIG. 7A is maintained, the following issue may develop. Namely, when the break 93 is released after removal of the obstacle 146 and the hood 50 starts to rotate in the closing direction, compressed air of one side in the driving unit (air cylinder) 84 is completely removed. Accordingly, if compressed air is supplied, a large rotational force is suddenly exerted in the closing direction and the hood 50 starts to rotate suddenly. Therefore, there is a possibility for endangering the operator.

In order to eliminate the possibility for such a danger, in case the sensor 108 detects the presence of the obstacle 146, the host computer 110 converts the port of the solenoid valve 92 into the neutral port (port for maintaining the current state position), as illustrated in FIG. 7B. Accordingly, the driving unit 84 is simultaneously supplied with the compressed air for rotating the hood 50 in the opening direction and that for rotating the hood 50 in the closing direction.

By considering a possibility of danger in which the operator is caught in the hood 50 being rotated in the closing direction, the resilient members 130 are interposed between the hood 50 and the portion attached to the rotational axis 116, as illustrated in FIGS. 9A and 9B. Since only the hood 50 can be slightly rotated by an external force due to a shortening of the resilient members 130, the operator whose hand or the like is caught therein can easily pull out the inserted hand. Therefore, the safety can be improved from this point as well. Further, when the obstacle sensor 108 detects an obstacle and the micro switch 104 (see FIG. 2) detects that the hood 50 in the closed state is opened by an external force, it is preferable to temporarily stop the second transfer unit 22 in the inlet side transfer chamber 10 for safety.

The semiconductor processing system 2 having the port structures in accordance with the aforementioned embodiment is an example to which the present invention is applied. Thus, the present invention can be equally applied to other types of semiconductor processing systems. Further, the number of the port structures in the semiconductor processing system 2 is only an example and, further, can be more than or less than three.

Furthermore, even though a semiconductor wafer as a substrate to be processed has been described as an example in the aforementioned embodiment, the present invention can be applied to a glass substrate, an LCD substrate and the like without being limited thereto.

While the invention has been shown and described with respect to the preferred embodiments, it will be understood by those skilled in the art that various changes and modifications may be made without departing from the spirit and scope of the invention as defined in the following claims.

What is claimed is:

1. A port structure for loading and unloading a substrate to be processed into and from a semiconductor processing system, wherein an inside of the system is set to have a positive pressure compared to an outside thereof by a gas supply, the port structure comprising:
    a bulkhead for partitioning the inside and the outside of the system and having a port for passing therethrough the substrate to be processed;
    a door for opening and closing the port;
    a table disposed outside the system to face the port, wherein the table is provided with a mount region for mounting thereon an open cassette accommodating therein a plurality of substrates to be processed in multi-levels;
    a hood rotatably disposed between a closed position and an open position with respect to the table, wherein the hood at the closed position forms, together with the bulkhead and the table, a closed space surrounding the mount region and the port, the closed space having a size to accommodate therein the cassette mounted on the mount region, and the hood at the open position exposes the mount region;
    a driving unit for rotating the hood;
    first ventholes formed through at least one of the bulkhead and the door so as to introduce the gas from the inside of the system into the closed space; and
    second ventholes formed through the table so as to discharge the gas out of the closed space.

2. The port structure of claim 1, wherein a leading end portion of the hood at the closed position is in a noncontact state wherein there exists a narrow gap between the leading end portion and a part facing thereto.

3. The port structure of claim 1, wherein the driving unit is disposed under the table and covered with a driving unit cover for preventing particles from being scattered.

4. The port structure of claim 1, wherein the table has a slit for passing the rotating hood therethrough, and the hood is located under the table while in the open position.

5. The port structure of claim 4, wherein the second ventholes are disposed between the mount region and the slit.

6. The port structure of claim 1, wherein a break for stopping a rotation of a driving axis is disposed at the driving axis of the driving unit.

7. The port structure of claim 6, wherein the break is covered with a break cover for preventing particles from being scattered.

8. The port structure of claim 1, wherein the hood includes a mountable and detachable window for maintaining and repairing an inner surface of the hood.

9. The port structure of claim 1, wherein the hood is coupled to a transfer member for transferring a driving force of the driving unit to the hood via a resilient member, and the resilient member is compressed by an external force exerted to the hood to allow a distance between the hood and the transfer member to be reduced.

10. The port structure of claim 6, further comprising a sensor for detecting a presence of an obstacle disposed near the port and a control unit for operating the break when the sensor detects the obstacle.

11. The port structure of claim 10, wherein the driving unit includes an actuator operated by a fluid in an opening direction and a closing direction, and a fluid pressure in both the opening direction and the closing direction is applied to the actuator when the break is operated.

12. The port structure of claim 1, further comprising a pair of protection plates standing at both sides of the table to cover both side surfaces of the hood while maintaining slight gaps therebetween.

* * * * *